(12) United States Patent
Nie et al.

(10) Patent No.: US 8,385,484 B2
(45) Date of Patent: Feb. 26, 2013

(54) METHOD AND APPARATUS FOR DETECTION AND CANCELLATION OF SINGLE-TONE OR MULTI-TONE INTERFERENCE IN COMMUNICATION SYSTEMS

(75) Inventors: Yuanfei Nie, Shanghai (CN); Gang Hu, Shanghai (CN); Meiwu Wu, Shanghai (CN)

(73) Assignee: Montage Technology (Shanghai) Co., Ltd., Shanghai (CN)

( * ) Notice: Subject to any disclaimer, the term of this patent is extended or adjusted under 35 U.S.C. 154(b) by 627 days.

(21) Appl. No.: 12/336,108

(22) Filed: Dec. 16, 2008

(65) Prior Publication Data
US 2010/0098197 A1 Apr. 22, 2010

(30) Foreign Application Priority Data
Oct. 20, 2008 (CN) .......................... 2008 1 0201404

(51) Int. Cl.
*H03D 1/04* (2006.01)
(52) U.S. Cl. ........ 375/346; 375/146; 375/147; 375/260; 375/262; 375/267; 375/347

(58) Field of Classification Search .................. 370/203, 370/204, 205, 206, 207, 208, 209, 210; 375/260, 375/267, 343, 346, 295, 296, 297
See application file for complete search history.

(56) References Cited

U.S. PATENT DOCUMENTS

| 7,324,437 B1* | 1/2008 | Czylwik et al. ............... 370/210 |
| 7,362,832 B2* | 4/2008 | Yoshida ........................ 375/348 |
| 7,813,701 B2* | 10/2010 | Strong et al. ................. 455/63.1 |
| 2006/0003795 A1* | 1/2006 | Yamanaka et al. ......... 455/550.1 |
| 2010/0177857 A1* | 7/2010 | Huttunen et al. ............. 375/350 |

* cited by examiner

*Primary Examiner* — Dhaval Patel
(74) *Attorney, Agent, or Firm* — Jun He Law Offices P.C.; James J. Zhu (57) ABSTRACT

A method and system for canceling an interference signal are provided. In the method, a received signal is transformed from a time domain to a frequency domain at relative low precision to obtain an estimated frequency and an estimated amplitude of the interference signal. A reference signal is generated using the estimated frequency and the estimated amplitude. An error signal is generated using the received signal and the reference signal based on minimum correlation criteria. The reference signal is adjusted using the error signal based on an adaptive algorithm. The reference signal is subtracted from the received signal to obtain the useful signal.

15 Claims, 7 Drawing Sheets

METHOD AND APPARATUS FOR DETECTION AND CANCELLATION OF SINGLE-TONE OR MULTI-TONE INTERFERENCE IN COMMUNICATION SYSTEMS

PRIORITY CLAIM

This application claims the benefit of Chinese Patent Application No. 200810201404.1, filed Oct. 20, 2008, which is incorporated herein by reference.

BACKGROUND

Strong single-tone or multi-tone interference degrades the performance of communication receivers. Such interference may be single-tone or multi-tone signals existing in the transmitting space, or harmonics imported from the circuit board, or residual signal of radio frequency (hereinafter, "RF") modulation or demodulation, and so on. For single carrier systems, a single-tone or multi-tone interference degrades the effective signal-to-noise (hereinafter, "SNR"). For multi-carrier systems, such as orthogonal frequency division multiplexing (hereinafter, "OFDM") systems, a single-tone or multi-tone interference not only can destroy data of one or more sub-carriers, but also can decrease the precision of the synchronization and channel estimation. One conventional method for canceling interference detects the frequency of an interference signal and then removes it from the received signal using one or more notch filters. But in practice, a notch filter can not be made ideal and its transition zone may impact data of adjacent sub-carriers, leading to performance degradation of the system.

Conventionally, the frequency of an interference signal in white noise can be detected either in frequency domain or in time domain. For the frequency domain method, the frequency of the interference signal can be detected and estimated by transforming the received signal from time domain to frequency domain using a time-frequency transform such as Discrete Fourier Transform (hereinafter, "DFT") or Discrete Cosine Transform (hereinafter, "DCT"). But for both DFT and DCT, if the point number is small, estimation precision can be low, and if the point number is large, computing complexity of the transform will be high. Additionally, even if the point number is large, the frequency resolution of the transform is still limited, that is to say the estimated frequency may still deviate from the real frequency of the interference signal. Some advanced signal processing technologies, such as wavelet basis or other basis, may solve the precision problem. However, such technologies are impractical in receivers due to high computing complexity.

For the time domain method, the received signal can be processed through difference processing to generate a sequence having a common phase. The frequency of the interference signal can then be obtained by extracting the common phase from the sequence. In this method, when the SNR is high enough, good performance can be achieved using only a short sequence. But its computing complexity is still very high due to matrix operation though some iterative methods can be used. Further, this method can not track the change of the interference well.

Therefore, it is necessary to provide a method and a system for canceling single-tone or multi-tone interference signals that can solve the above mentioned problems.

SUMMARY

In one aspect, a method for canceling interference signal(s) from a received signal is provided. The method comprises the following steps: transform the received signal from time domain to frequency domain; estimate the frequency of an interference signal based on the results of the time-frequency transform to obtain an estimated frequency; obtain an estimated amplitude of the interference signal; generate a reference signal using the estimated frequency and the estimated amplitude, generate an error signal using the reference signal and the received signal based on minimum correlation criteria, adjust the reference signal using the error signal based on an adaptive algorithm to make the reference signal approach the interference signal; subtract the reference signal from the received signal to cancel the interference signal and to produce a refined signal; and output the refined signal.

In the present application, an order of describing steps of a method is intended to illustrate the method in a clear manner, not to limit the scope of the application.

In one embodiment, the estimated amplitude can be obtained by estimating the amplitude of the interference signal based on the results of the time-frequency transform.

In another embodiment, the estimated amplitude can be an arbitrary value.

In one embodiment, the error signal can be defined as:

$$\sigma(n)=(R(n)-I'(n))\mathrm{conj}(I'(n))$$

wherein R(n) represents the received signal, I'(n) represents the reference signal, and n represents number of sampling times.

In another embodiment, the error signal can be defined as:

$$\sigma(n)=(R(n)-I'(n))\mathrm{conj}(R(n))$$

In one embodiment, the reference signal can be defined as:

$$I'(n)=A'(n)\exp(j*2*\pi*f_0*n*T_s+j*\xi(n))$$

Wherein, A'(n) represents the amplitude part of the reference signal, $\exp(j*2*\pi*f0*n*Ts+j*\xi(n))$ represents the phase part of the reference signal, $f_0$ represents the estimated frequency, $T_s$ represents sampling interval, $\xi(n)$ represents a dynamic component of the phase part.

The phase part of a reference signal in the application comprises two components, one is the product of an estimated frequency and sampling time, the other is a dynamic component that needs to be updated with sampling time.

In one embodiment, a least mean square (hereinafter, "LMS") algorithm is used, and the reference signal can be adjusted or updated using the following equations:

$$A'(n)=A'(n-1)+\lambda_1*\sigma(n-1);$$

$$\theta(n)=\mathrm{mod}(\theta(n-1)+\lambda_2*\mathrm{angle}(A'(n)),2*\pi); \text{ and}$$

$$\xi(n)=\mathrm{mod}(\theta(n)+\lambda_3*\mathrm{angle}(A'(n)),2*\pi).$$

Wherein, $\lambda_1$, $\lambda_2$ and $\lambda_3$ are corresponding updating steps.

Other adaptive algorithms can be used to adjust the reference signal, these algorithms include but not limited to all kinds of LMS algorithms and all kinds of recursive least square (hereinafter, "RLS") algorithms. In one embodiment, the refined signal is outputted into a storage medium.

In another aspect, a system for canceling interference signal(s) is provided. The system comprises an interference frequency detecting module, an estimated amplitude generating module, a numerical controlled oscillator, a multiply operation module, an error signal generating module, an updating module, and an add operation module. The interference frequency detecting module receives the received signal and transforms the received signal from time domain to frequency domain, and then estimate the frequency of an interference signal to obtain an estimated frequency based on the results of the time-frequency transform. The estimated amplitude generating module generates an estimated amplitude of the interference signal. The numerical controlled oscillator receives the estimated frequency from the interference frequency detecting module and a dynamic component of a reference signal from the updating module, and generates a phase part of the reference signal by calculating based on the estimated frequency and the dynamic component. The multiply operation module receives the phase part of the reference signal from the numerical controlled oscillator and an amplitude part of the reference signal from the updating module, and multiplies the two to generate the reference signal. The error signal generating module receives the received signal and the reference signal from the multiply operation module, and generates the error signal using the two based on minimum correlation criteria. The updating module receives the error signal from the error signal generating module, and updates the amplitude part and the dynamic component of the reference signal based on adaptive algorithm. The add operation module receives the received signal and the reference signal from the multiply operation module, and subtracts the reference signal from the received signal to cancel the interference signal.

In one embodiment, the function of generating the estimated amplitude can be integrated in the interference frequency detecting module. In another embodiment, the function of generating the estimated amplitude can be integrated in the updating module.

In one embodiment, the estimated amplitude can be generated based on the results of the time-frequency transform. In another embodiment, the estimated amplitude can be an arbitrary value generated by the estimated amplitude generating module.

In one embodiment, the reference signal can be defined as:

$$\Gamma(n)=A'(n)\exp(j*2*\pi*f_0*n*T_s+j*\xi(n))$$

Wherein, $A'(n)$ represents the amplitude part of the reference signal, $\exp(j*2*\pi*f_0*n*T_s+j*\xi(n))$ represents the phase part of the reference signal, and $\xi(n)$ represents the dynamic component. Wherein, the dynamic component is a variable of the phase part.

In one embodiment, the error signal can be defined as:

$$\sigma(n)=(R(n)-\Gamma(n))\text{conj}(\Gamma(n))$$

In another embodiment, the error signal can be defined as:

$$\sigma(n)=(R(n)-\Gamma(n))\text{conj}(R(n))$$

In one embodiment, the updating module uses LMS algorithm to update the reference signal by the following equations:

$$A'(n)=A'(n-1)+\lambda_1*\sigma(n-1);$$

$$\theta(n)=\text{mod}(\theta(n-1)+\lambda_2*\text{angle}(A'(n)),2*\pi); \text{ and}$$

$$\xi(n)=\text{mod}(\theta(n)+\lambda_3*\text{angle}(A'(n)),2*\pi).$$

As low precision time-frequency can be applied, compared with conventional approaches, the computing complexity of the approaches provided by the present application is decreased. In addition, the reference signal can approach the interference signal, which improves the tracking accuracy.

BRIEF DESCRIPTION OF THE DRAWINGS

The accompanying drawings are included to provide a further understanding of the present application and are incorporated in and constitute a part of this specification. The drawings illustrate the embodiments of the present application and together with the description serve to explain the principles of the application. Other embodiments of the present application and many of the intended advantages of the present application will be readily appreciated, as they become better understood by reference to the following detailed description. The elements of the drawings are not necessarily to scale relative to each other. Like reference numerals designate corresponding similar parts.

DETAILED DESCRIPTION OF ILLUSTRATED EMBODIMENTS

In the following detailed description, reference is made to various specific embodiments of the invention. These embodiments are described with sufficient detail to enable those skilled in the art to practice the application. It is to be understood that other embodiments may be employed, and that various structural, logical and electrical changes may be made without departing from the spirit or scope of the application.

Figure 1:
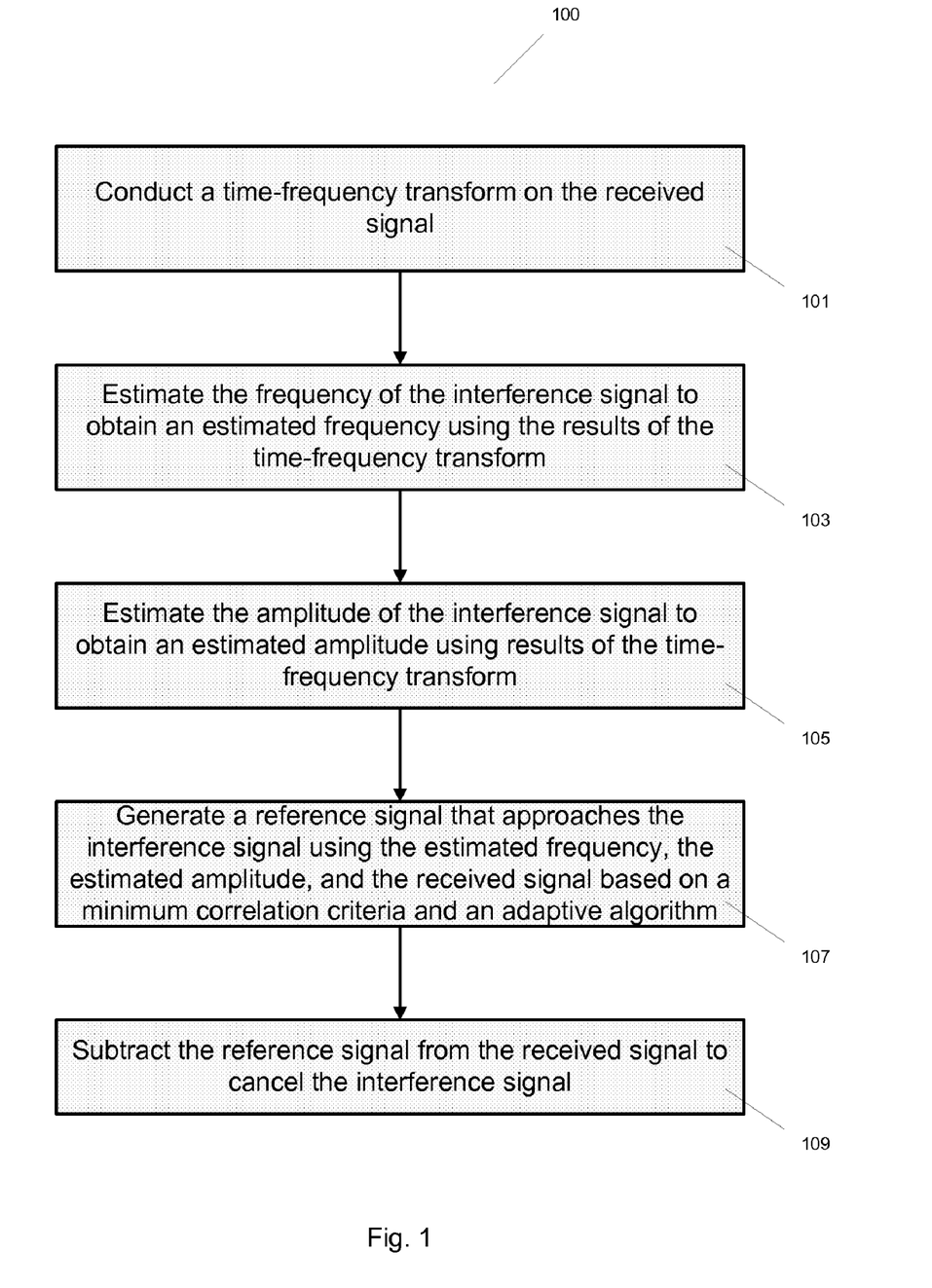
FIG. 1 illustrates a flowchart of a method for canceling interference signal of one embodiment of the present application.

Referring to FIG. 1, a flowchart of a method 100 for canceling interference signal is illustrated. The method 100 comprises the following steps: transform a received signal from time domain to frequency domain (step 101); compute an estimated frequency of an interference signal based on the results of the time-frequency transform (step 103); compute an estimated amplitude of the interference signal based on the results of the time-frequency transform (step 105); based on minimum correlation criteria and an adaptive algorithm, generate a reference signal, which approaches the interference signal, using the estimated frequency and the estimated amplitude (step 107); subtract the reference signal from the received signal to obtain a refined signal and output the refined signal (step 109).

In one embodiment, a sample of the received signal is transformed from time domain to frequency domain, and the result of the time-frequency transform is used to compute the estimated frequency of the interference. In another embodiment, the result of the time-frequency transform is used to compute the estimated amplitude of the interference.

The approaches provided by the present application can be used to cancel single-tone interference signal, multi-tone interference signal, or narrow band interference signal.

In one embodiment, the frequency spectrum of the useful signal is relatively smooth.

In step 101, any known time-frequency transform method can be used, these methods include but not limited to Fast Fourier Transform (hereinafter "FFT") and Discrete Cosine Transform (hereinafter, "DCT"). In one embodiment, a low precision time-frequency transform such as a small point number FFT can be used to decrease computing complexity.

In one embodiment, in step 103, the frequency of a peak in a frequency spectrum obtained by the time-frequency transform can be detected and taken as the estimated frequency. In another embodiment, the estimated frequency can be calculated based on the frequency spectrum.

An estimated frequency is obtained by estimating the frequency of a corresponding interference signal. An estimated amplitude can be obtained by estimating the amplitude of a corresponding interference signal, or can be an arbitrary value. In most cases, using an estimated amplitude that is obtained by estimating the amplitude of a corresponding interference signal can shorten the time of capture the interference signal.

In one embodiment, in step 105, the estimated amplitude can be calculated based on the results of the time-frequency transform. In another embodiment, the estimated amplitude can be an arbitrary value.

In one embodiment, an amplitude threshold is set, and the result of the time-frequency transform is compared with the threshold. A signal with an amplitude larger than the threshold will be treated as an interference signal.

If an interference signal is captured, the reference signal is close to the interference signal. Thus, the difference between the reference signal and the interference signal is resulted from the precision of the system. Tracking an interference signal means updating the reference signal after capturing the interference signal to track any changes of the interference signal.

In one embodiment, in step 107, the phase part of the reference signal can be calculated using the sum of the dynamic component and the product of the estimated frequency and sampling time.

In one embodiment, the amplitude part and the phase part of the reference signal is updated using the error signal based on an adaptive algorithm. For example, the error signal is generated using the received signal and the reference signal based on minimum correlation criteria. Any suitable adaptive algorithm can be applied here, such as basic LMS, Block LMS, Extended LMS, and all kinds of RLS or any other adaptive algorithm.

In one embodiment, interference signal can be defined as equation 1:

$$I(t) = \sum_{M} A_M(t) * \exp(j*2*\pi*f_{M_i}*t + j*\varphi_M(t)) \quad \text{equation 1}$$

Wherein, M represents a number of interference signals, $A_M(t)$ represents the amplitude part of the $M^{th}$ interference signal, $f_{M_i}$ represents the frequency of the $M^{th}$ interference signal, $\phi_M(t)$ represents a dynamic component of the phase part of the $M^{th}$ interference signal, $\exp(j*\phi)=\cos(\phi)+j*\sin(\phi)$, and $j=\sqrt{-1}$.

In one embodiment, the received signal R(t) can be defined as equation 2:

$$R(t)=S(t)+I(t) \quad \text{equation 2}$$

Wherein, S(t) represents a useful signal.

If reference signals that approach corresponding interference signals can be generated, the useful signal can be obtained by subtracting the reference signals from the received signal. In one embodiment, a reference signal can be defined as equation 3:

$$I'(t) = \sum_{M} A'_M(t) * \exp(j*2*\pi*f_{0M}*t + j*\xi_M(t)) \quad \text{equation 3}$$

Wherein, M represents the number of reference signals, $A'_M(t)$ represents the amplitude part of the $M^{th}$ reference signal, $f_{0M}$ represents the estimated frequency of the $M^{th}$ reference signal, $\xi_M(t)$ represents the dynamic component (a dynamic component of the phase part) of the $M^{th}$ reference signal.

In one embodiment, the error signal representing an error between the reference signal and the interference signal can be defined as equation 4:

$$\delta(t)=\|I(t)-I'(t)\|^2 \quad \text{equation 4}$$

Wherein, $\delta(t)$ approaches 0 with time. Any other algorithms based on minimum correlation criteria can be used to calculate the error signal.

As the interference signal is independent of the useful signal, in one embodiment, the error signal can also be defined as equation 5:

$$\delta(t)=\|R(t)-I'(t)\|^2=(R(t)-I'(t))\text{conj }(I'(t))+(R(t)-I'(t))\text{conj}(R(t)) \quad \text{equation 5}$$

Wherein, conj represents conjugate operation.

In one embodiment, the signal defined by equation 5 can be used directly to update the reference signal based on an adaptive algorithm. In another embodiment, any part of the signal defined by equation 5 that can be used to update the phase part of the reference signal can be used to update the reference signal.

In one embodiment, a part of the signal defined by equation 5 can be used as an error signal to update the reference signal. The error signal is defined as equation 6:

$$\sigma(t)=\|R(t)-I'(t)\|^2=(R(t)-I'(t))\text{conj}(I'(t)) \quad \text{equation 6}$$

In a digital adaptive structure, the error signal can be defined as equation 7:

$$\sigma(n)=(R(n)-I'(n))\text{conj}(I'(n)) \quad \text{equation 7}$$

Wherein, n represents a number of sampling times.

The reference signal can be defined as equation 8:

$$I'(n)=A'(n)\exp(j*2*\pi*f_0*n*T_s+j*\xi(n)) \quad \text{equation 8}$$

Wherein, $T_s$ represents a sampling interval.

When basic LMS is applied, the reference signal can be updated using equations 9 to 11:

$$A'(n)=A'(n-1)+\lambda_1*\sigma(n-1) \quad \text{equation 9}$$

$$\theta(n)=\text{mod}(\theta(n-1)+\lambda_2*\text{angle}(A'(n)),2*\pi) \quad \text{equation 10}$$

$$\xi(n)=\text{mod}(\theta(n)+\lambda_3*\text{angle}(A'(n)),2*\pi) \quad \text{equation 11}$$

Wherein, mod represents mode operation and angle represents calculation of angle.

In one embodiment, the reference signal can be updated with one or more sampling times. Therefore, n in the application covers all the cases.

In some cases, the interference signal may change slowly with time.

In one embodiment, steps 101-105 can be conducted at regular intervals to check whether there is new interference signal, or whether the interference signal to be canceled currently disappears.

A set of updating equations such as equations 9-11 can be established according to an applied adaptive algorithm. Wherein, $\lambda_1$, $\lambda_2$ and $\lambda_3$ are corresponding updating steps.

As the coupling of these steps is dependent and nonlinear, these steps can not be calculated with traditional setting methods. In one embodiment, the system is analogous to a filter, and the relationship between these steps can be obtained by modifying the filter. From the set of updating equations, it can be found that the dynamic component $\xi(n)$ and its component $\theta(n)$ are updated using the amplitude $A'(n)$. To prevent the attenuation of the error signal, the amplitude $A'(n)$ is required to change slower than $\theta(n)$ and $\xi(n)$, therefore, $\lambda_1$ should be less than $\lambda_2$ and $\lambda_3$. In addition, to make the filter stable, $\lambda_2$ is required to be less than $\lambda_3$. If equations 9-11 are treated as a second-order filter, the relationship between $\lambda_1$, $\lambda_2$ and $\lambda_3$ can be obtained according to the stability condition of the filter, and then the updating steps can be obtained by searching using the relationship.

The phase part of the reference signal has two components: a first component is the product of frequency and time, and a second component is the dynamic component.

In one embodiment, the update loop of $A'(n)$ and $\theta(n)$ is treated as a IIR filter having similar structure, the corresponding transfer function of the filter can be defined as equation 12:

$$G(Z) = \left(c_1 \frac{z^{-1}}{1-z^{-1}} + c_2\right) \frac{z^{-1}}{1-z^{-1}} \qquad \text{equation 12}$$

Wherein, $c_1$ is analogous to $\lambda_1$, and $c_2$ is analogous to $\lambda_2$, and:

$$c_1 = 2\eta w_n \qquad \text{equation 13}$$

$$c_2 = w_n^2 \qquad \text{equation 14}$$

Wherein, $w_n$ is the natural frequency of the filter, $\eta$ is an attenuation coefficient, and the stability condition of the filter is $2\eta > w_n$.

After testing transfer functions corresponding to different frequencies respectively, $\eta = 1/2$ has been found to be optimal (please see Y. R. Shayan, T. Le-Ngoc. "All digital phase-locked loop: concepts, design and application" Radar and Signal Processing, IEEE Proceedings F Volume 136, Issue 1, February 1989 Page(s): 53-56). Thus, $c_1 = c_2^2$. Because the update of the reference signal is analogous to the filter, the relationship between $\lambda_1$ and $\lambda_2$ can be set as $\lambda_1 = \lambda_2^2$. The update of $\theta(n)$ is parallel with the second part of $\xi(n)$ ($\lambda_3 *$angle$(A'(n)), 2*\pi$), in order to accelerate convergence, $\lambda_3$ can be set larger than $\lambda_2$. The relationship between the steps obtained in such way can restrict a search space for the steps such that the steps can be obtained using ordinary algorithms.

In one embodiment, the steps can be calculated by computer simulation. In one embodiment, the computer simulation can be executed in the whole signal transmitting system. The signal transmitting system can compare convergence speed, residual interference (e.g. mean square error, herein-after "MSE"), and tracking capability of different step settings. In most cases, convergence speed conflicts with residual interference, so a tradeoff is selected between the two. System level simulations are time-consuming, and a cost function can be established to reduce time needed. The cost function can be established by weighting one or more of MSE, convergence speed, and tradeoff setting etc. In one example, MSE and convergence speed are weighted in a cost function defined as equation 15:

$$J(n) = \kappa_1 \|I'(n) - I(n)\|^2 + \kappa_2 N(n) \qquad \text{equation 15}$$

Wherein, $N(n)$ represents the number of sampling times needed to achieve a MSE that is less than a given threshold, $\kappa_1$ and $\kappa_2$ are corresponding weight coefficients and can be determined by the tradeoff selected above. In order to accelerate the search for the steps, one of gradient search methods and annealing algorithms can be used. In these methods, a group of steps are set to establish a cost function. One step is then adjusted within a relatively large amount. If the cost function decreases with the adjustment, then continue adjusting the step in the same direction. If the cost function increases, adjust the step in the opposite direction. When an optimal value of the step is achieved, stop adjusting the step and begin adjusting another step. Constant steps or variable increments can be used to adjust the steps. Alternatively, any kind of non-linear optimization algorithms can be used.

For multi-tone interference, reference signals corresponding to the interference signals can be generated with the methods discussed above. The reference signals are subtracted from the received signal to achieve a useful signal. In one embodiment, the received signal can be used with a corresponding reference signal to generate a corresponding error signal. In another embodiment, a signal produced by refining the received signal one or more times (subtracting one or more reference signals from the received signal) can be used with a corresponding reference signal to generate a corresponding error signal. The term "received signal" includes both an unrefined or unprocessed received signal and a refined or processed received signal. In one embodiment, all reference signals can be generated in parallel, and then subtracted from the received signal in parallel to achieve the useful signal.

A method for canceling a narrow-band interference signal will be described below. A narrow-band interference signal can be defined as equation 16:

$$I_{narrow}(t) = \eta(t) * \exp(j * 2 * \pi * f_n * t) \qquad \text{equation 16}$$

Wherein, $\eta(t)$ represents a modulated signal having a bandwidth less than $B_n$, which represents the bandwidth of the narrow-band interference signal. In the digital domain, the narrow-band interference signal can be considered interference signals that interfere $\text{int}(B_n/\Delta f)$ sub-carriers around carrier frequency $f_n$ respectively. Because the interference signals are dependent on each other, they can be modeled as a multi-tap single-tone interference signal. The multi-tap single-tone interference signal can then be canceled with the above method.

In one embodiment, a RLS algorithm is applied to update the reference signal. In one embodiment, the reference signal can be updated with equations 17-19:

$$A(n) = A(n-1) + k(n) * \text{conj}(\sigma(n)) \qquad \text{equation 17}$$

$$k(n) = \frac{P(n-1) * R(n)}{\lambda + \text{conj}(R(n)) * P(n-1) * R(n)} \qquad \text{equation 18}$$

$$P(n) = [P(n-1) - k(n) * \text{conj}(R(n)) * P(n-1)] / \lambda \qquad \text{equation 19}$$

Wherein, λ is a forgetting factor between 0 and 1. P(0) can be a small enough positive constant. The phase and the frequency of the reference signal can be updated using RLS or LMS algorithms. The parameters of the reference signal can be updated in different sequences, for example, the phase part of the reference signal can be updated first, and the amplitude part of the reference signal can be updated based on the updated phase part.

Figure 2:
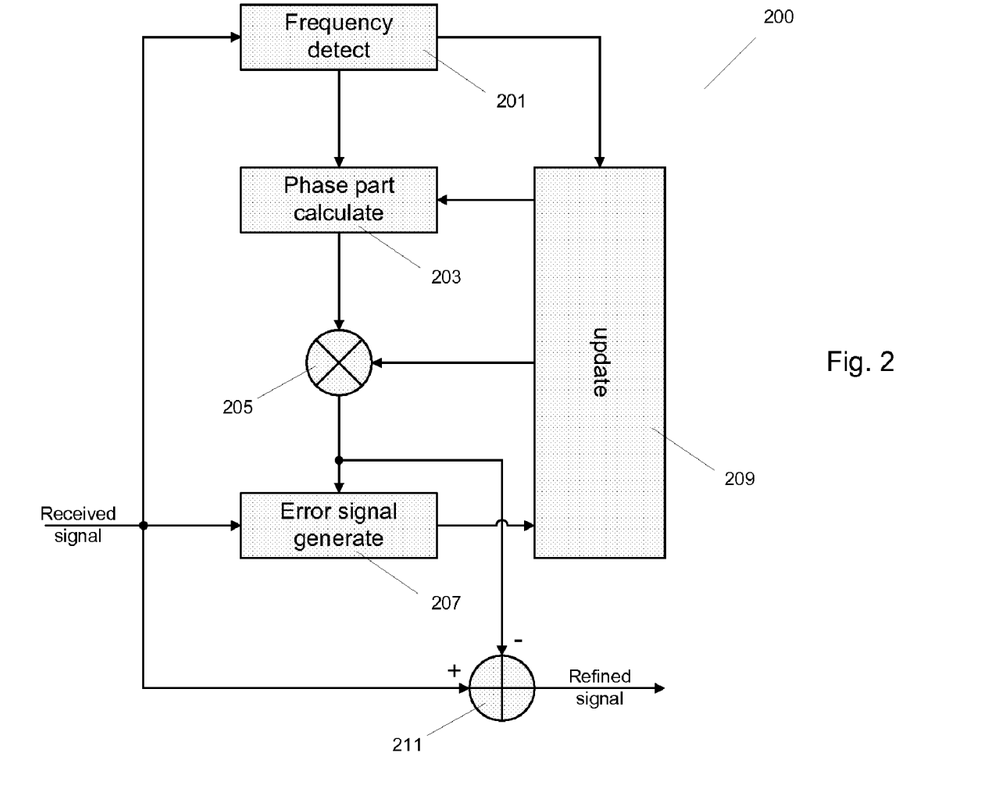
FIG. 2 illustrates a block diagram of a system for canceling interference signal of one embodiment of the present application.

Referring to FIG. 2, a block diagram of a system 200 for canceling interference signal(s) from a received signal is illustrated. The system 200 comprises an interference frequency detecting module 201 for estimating the frequency of an interference signal to obtain an estimated frequency; a phase calculating module 203 for generating a phase part of a reference signal that approaches the interference signal; a multiply operation module 205 for multiplying an amplitude part and the phase part of the reference signal to generate the reference signal; an error signal generating module 207 for generating an error signal using the received signal and the reference signal; an updating module 209 for updating the amplitude part and a dynamic component of the phase part of the reference signal; and an add operation module 211 for subtracting the reference signal from the received signal to cancel the interference signal.

The interference frequency detecting module 201 transforms the received signal from time domain to frequency domain, and estimates the frequency of the interference signal to obtain the estimated frequency based on the results of the time-frequency transform. In one embodiment, the interference frequency detecting module 201 can also estimate the amplitude of the interference signal to obtain an estimated amplitude based on the results of the time-frequency transform to improve the capture of the interference signal. In another embodiment, the function of generating the estimated amplitude can be integrated in the updating module 209. Any known method can be applied to realize the time-frequency transform, for example, FFT and DCT. Each adaptive algorithm has a dynamic range. As long as the precision of the time-frequency transform is in the dynamic range, the interference signal can be captured. Therefore, low precision time-frequency transform such as low point number FFT can be applied to reduce computing complexity.

The phase calculating module 203 receives the estimated frequency from the interference frequency detecting module 201 and the dynamic component of the phase part of the reference signal from the updating module 209, and calculates the phase part of the interference signal using the two. In one embodiment, the phase calculating module 203 is a numerical controlled oscillator, and it calculates the phase part of the reference signal according to the part "exp $(j*2*\pi*f_0*n*T_s+j*\xi(n))$" of equation 8. The multiply operation module 205 receives the phase part of the reference signal from the phase calculating module 203 and the amplitude part of the reference signal from the updating module 209, and multiplies the two to generate the reference signal. The error signal generating module 207 receives the received signal and the reference signal from the multiply operation module 205, and generates an error signal using the two based on minimum correlation criteria. In one embodiment, the error signal generating module 207 generates the error signal according to equation 7. The updating module 209 receives the error signal from the error signal generating module 207, and updates the amplitude part and the dynamic component of the phase part of the reference signal using the error signal based on an adaptive algorithm. In one embodiment, the updating module 209 updates the amplitude part and the dynamic component of the reference signal according to equations 9-11. The add operation module 211 receives the received signal and the reference signal, and subtracts the reference signal from the received signal to cancel the corresponding interference signal.

Figure 3:
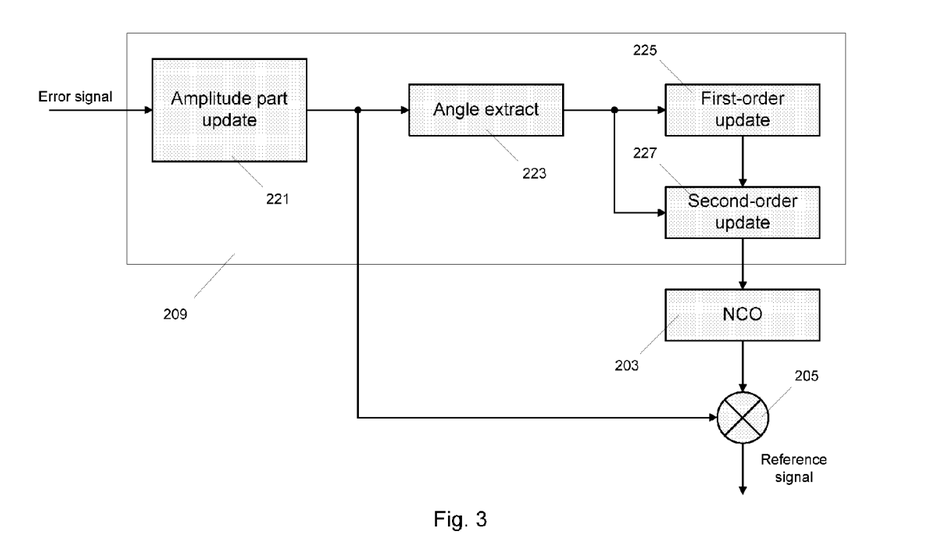
FIG. 3 illustrates a block diagram of an updating module of the system for canceling interference signal of one embodiment of the present application.

Referring to FIG. 3, a block diagram of the updating module 209 in one embodiment is illustrated. The updating module 209 comprises an amplitude updating module 221, an angle extracting module 223, a first-order updating module 225, and a second-order updating module 227. The amplitude updating module 221 updates the amplitude part of the reference signal based on an adaptive algorithm, and sends the updated amplitude part to the angle extracting module 223 and the multiply operation module 205 of the system 200. In one embodiment, when a basic LMS algorithm is applied, the amplitude updating module 209 updates the amplitude part of the reference signal according to equation 9. The angle extracting module 223 extracts the angle of the updated amplitude part of the reference signal from the amplitude updating module 221. The first-order updating module 225 conducts first-order update of the phase part of the reference signal using the angle extracted by the angle extracting module 223 based on the adaptive algorithm. In one embodiment, the first-order updating module 225 conducts first-order update of the dynamic component of the phase part of the reference. In one embodiment, when a basic LMS algorithm is applied, the first-order updating module 225 updates a component θ(n) of the dynamic component according to equation 10. The second-order updating module 227 conducts second-order update of the phase part of the reference signal using the results from the first-order updating module 225 based on the adaptive algorithm. In one embodiment, when basic LMS algorithm is applied, the second-order updating module 227 updates the dynamic component using the results from the first-order updating module 225 and the angle extracted by the angle extracting module 223 according to equation 11. The updated dynamic component is then sent to the phase calculating module 203 of the system 200.

Figure 4A:
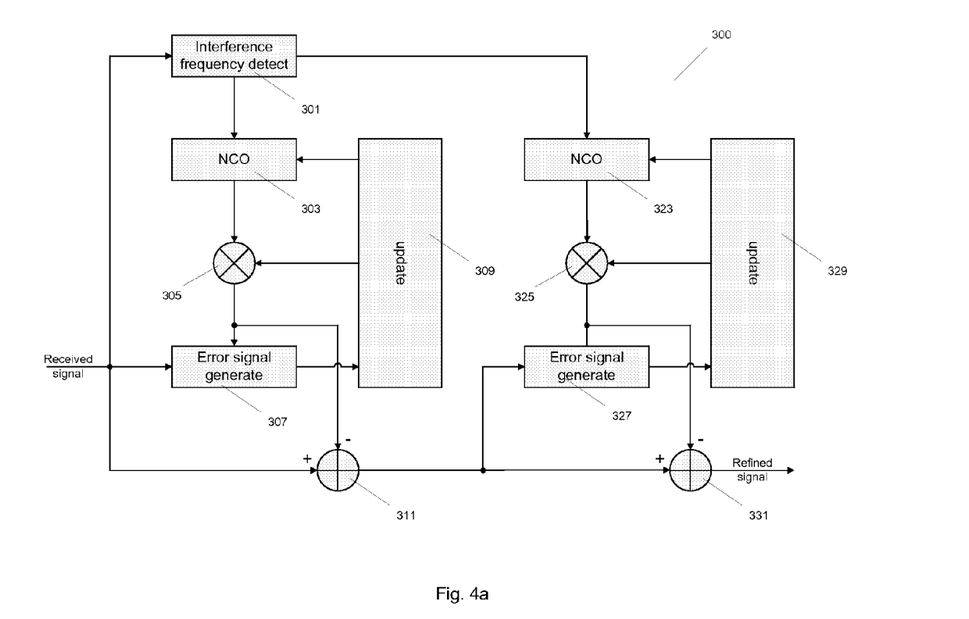
FIG. 4a illustrates a block diagram of a system for canceling interference signal of another embodiment of the present application.

Referring to FIG. 4a, illustrates a block diagram of a system 300 that can cancel two single-tone interference signals from a received signal. The system 300 comprises: an interference frequency detecting module 301 transforms the received signal from time domain to frequency domain, and estimates the frequencies of a first interference signal and a second interference signal using the results of the time-frequency transform to obtain a first estimated frequency and a second estimated frequency respectively; a first numerical controlled oscillator 303 receives the first estimated frequency from the interference frequency detecting module 301 and a dynamic component of a first reference signal corresponding to the first interference signal from a first updating module 309, and generates the phase part of the first reference signal using the two; a first multiply operation module 305 receives the amplitude part of the first reference signal from the first updating module 309 and the phase part of the first reference signal from the first numerical controlled oscillator 303, and multiplies the two to generate the first reference signal; a first error signal generating module 307 receives the first reference signal from the first multiply operation module 305 and the received signal, and generates a first error signal using the two based on minimum correlation criteria; the first updating module 309 receives the first error signal, and updates the amplitude part and the dynamic component of the first reference signal using the first error signal based on an adaptive algorithm; a first add operation module 311 receives the first reference signal from the first multiply operation module 305 and the received signal, and subtracts the first reference signal from the received signal to obtain a first output signal.

Figure 4B:
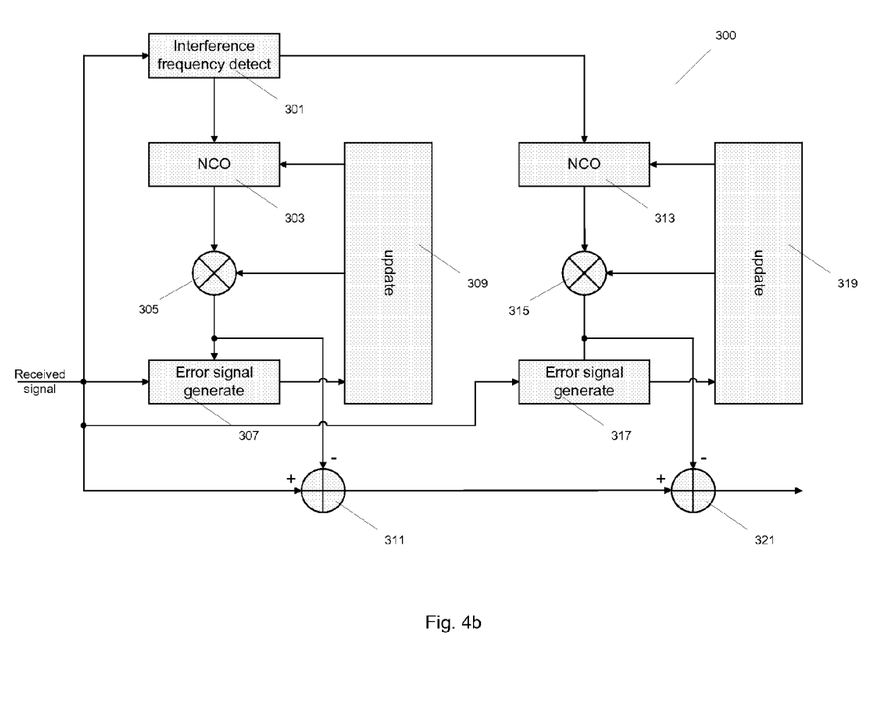
FIG. 4b illustrates a block diagram of a system for canceling interference signal of another embodiment of the present application.

The system 300 further comprises: a second numerical controlled oscillator 323 receives the second estimated frequency from the interference frequency detecting module 301 and a dynamic component of a second reference signal corresponding to the second interference signal from a second updating module 329, and generates the phase part of the second reference signal using the two; a second multiply operation module 325 receives the amplitude part of the second reference signal from the second updating module 329 and the phase part of the second reference signal from the second numerical controlled oscillator 323, and multiplies the two to generate the second reference signal; a second error signal generating module 327 receives the second reference signal from the second multiply operation module 325 and the first output signal, and generates a second error signal using the two based on minimum correlation criteria, in another embodiment, the received signal can be used to replace the first output signal to generate the second error signal such as the structure illustrated in FIG. 4b (Identical numericals are used in FIG. 4b with that of FIG. 4a, the only difference between the systems illustrated in FIG. 4a and FIG. 4b is that in the system illustrated in FIG. 4a, the first output signal is used to generate the second error signal, in the system illustrated in FIG. 4b, the received signal is used to generate the second error signal. Therefore, the system 300 illustrated in FIG. 4b will not be described in detail here.); the second updating module 329 receives the second error signal, and updates the amplitude part and the dynamic component of the second reference signal using the second error signal based on an adaptive algorithm; and a second add operation module 331 receives the second reference signal from the second multiply operation module 325 and the first output signal, and subtracts the second reference signal from the first output signal to cancel the second interference signal.

The modules of system 300 are similar with the corresponding modules of the system 200. As for a case in which there are more than two interference signals, a corresponding number of groups of modules can be added to cancel the interference signals, wherein one group of modules is for canceling one interference signal. In one embodiment, a predetermined number of groups of modules can be set in a system, wherein, the predetermined number can be obtained by estimating the number of interference signals. In one embodiment, if there are more than one interference signals, the interference signals can be canceled in an order established according to the positions of the interference signals in frequency spectrum, or an order established according to the energy of the interference signals.

In one embodiment, an updating module can be shared to update more than one reference signals.

Figure 5:
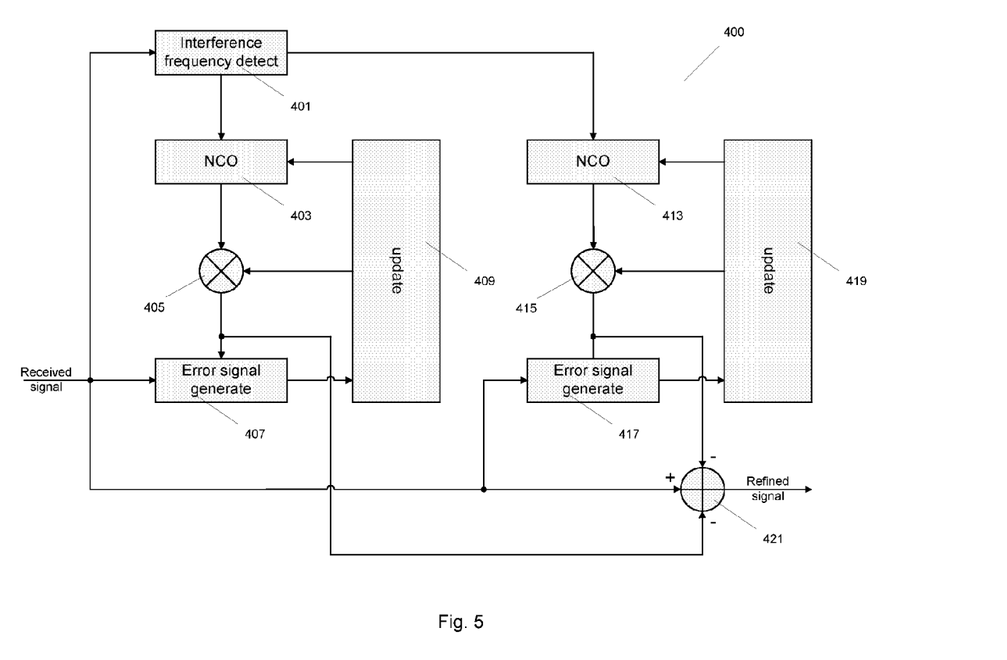
FIG. 5 illustrates a block diagram of a system for canceling interference signal of another embodiment of the present application.

Referring to FIG. 5, a block diagram of a system 400 that can cancel two interference signals is illustrated. The system 400 comprises: an interference frequency detecting module 401 that transforms the received signal from time domain to frequency domain, and estimates the frequencies of a first interference signal and a second interference signal to obtain a first estimated frequency and a second estimated frequency respectively using the results of the time-frequency transform; a first numerical controlled oscillator 403 that receives the first estimated frequency from the interference frequency detecting module 401 and a dynamic component of a first reference signal corresponding to the first interference signal from a first updating module 409, and generates the phase part of the first reference signal using the two; a first multiply operation module 405 that receives the amplitude part of the first reference signal from the first updating module 409 and the phase part of the first reference signal from the first numerical controlled oscillator 403, and multiplies the two to generate the first reference signal; a first error signal generating module 407 that receives the first reference signal from the first multiply operation module 405 and the received signal, and generates a first error signal using the two based on minimum correlation criteria; the first updating module 409 that receives the first error signal, and updates the amplitude part and the dynamic component of the first reference signal using the first error signal based on an adaptive algorithm.

The system 400 further comprises: a second numerical controlled oscillator 413 that receives the second estimated frequency from the interference frequency detecting module 401 and a dynamic component of a second reference signal corresponding to the second interference signal from a second updating module 419, and generates the phase part of the second reference signal using the two; a second multiply operation module 415 that receives the amplitude part of the second reference signal from the second updating module 419 and the phase part of the second reference signal from the second numerical controlled oscillator 413, and multiplies the two to generate the second reference signal; a second error signal generating module 417 that receives the second reference signal from the second multiply operation module 415 and the first received signal, and generates a second error signal using the two based on minimum correlation criteria; the second updating module 419 that receives the second error signal, and updates the amplitude part and the dynamic component of the second reference signal using the second error signal based on an adaptive algorithm; and an add operation module 421 that receives the first reference signal from the first multiply operation module 405, the second reference signal from the second multiply operation module 415, and the first output signal, and subtracts the first reference signal and the second reference signal from the received signal to cancel the first and the second interference signals.

EXAMPLE 1

Figure 6:
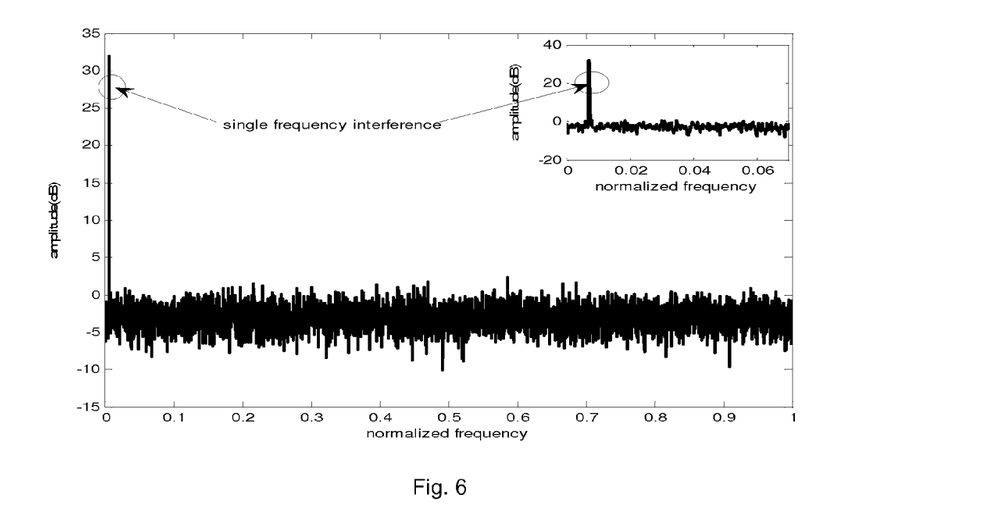
FIG. 6 illustrates a graph showing the power spectrum density of a received signal of example 1.

Referring to FIG. 6, a graph showing the power spectrum density of a received signal is illustrated, wherein, the received signal is a 16 QAM modulated 4K mode OFDM signal, and the channel is an additive white Gaussian noise with signal-to-noise ratio (SNR) of 5 dB channel, and superimposed with a slow changing single-tone interference signal of a frequency of 100.5 times that of interval of sub-carriers of the OFDM signal and a mean amplitude of 1.3. It can be seen in the FIG. 6 that the energy of the single-tone interference signal is 30 dB higher than that of the useful signal. In addition, because the single-tone interference signal has a frequency comprising a fractional component of sub-carrier interval, data of about 10 sub-carriers near the interference signal can be destroyed.

Figure 7:
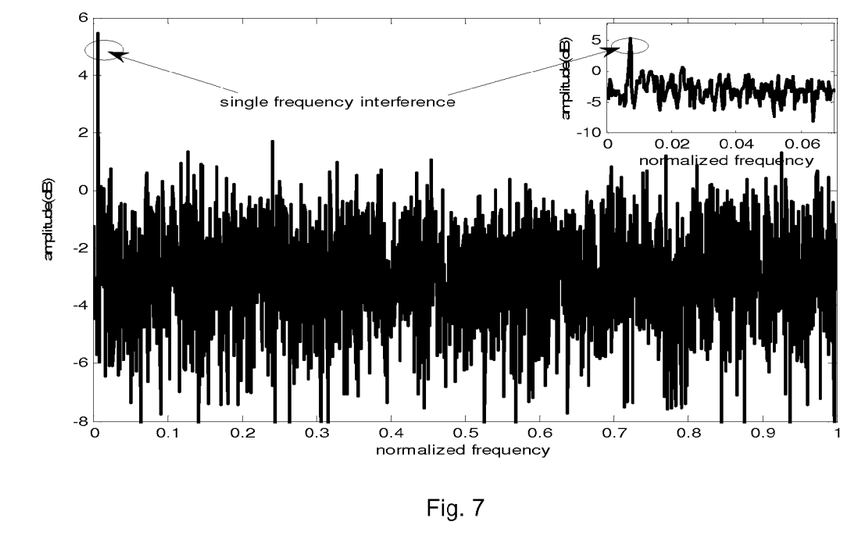
FIG. 7 illustrates a graph showing the power spectrum density of the refined received signal in capture stage in example 1.

Referring to FIG. 7, a graph showing the power spectrum density of the received signal refined by canceling a reference signal during the capture of the interference signal is illustrated. Compared with FIG. 6, the energy of the interference signal has been decreased, but is still 5 dB higher than that of the useful signal. Thus, corresponding data can still be destroyed. In this case, $\lambda_1=10^{-4}$, $\lambda_2=10^{-2}$, $\lambda_3=0.08$.

Figure 8:
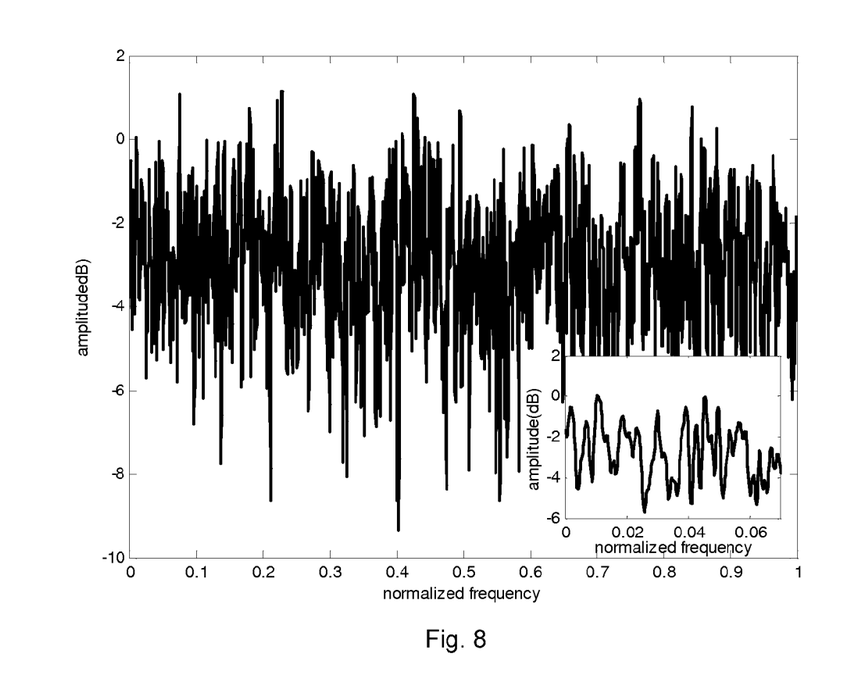
FIG. 8 illustrates a graph showing the power spectrum density of the refined received signal in tracking stage in example 1.

Referring to FIG. 8, a graph showing the power spectrum density of the refined received signal during the tracking of the interference signal is illustrated. It can be seen in FIG. 8 that the interference signal has been almost canceled.

Figure 9:
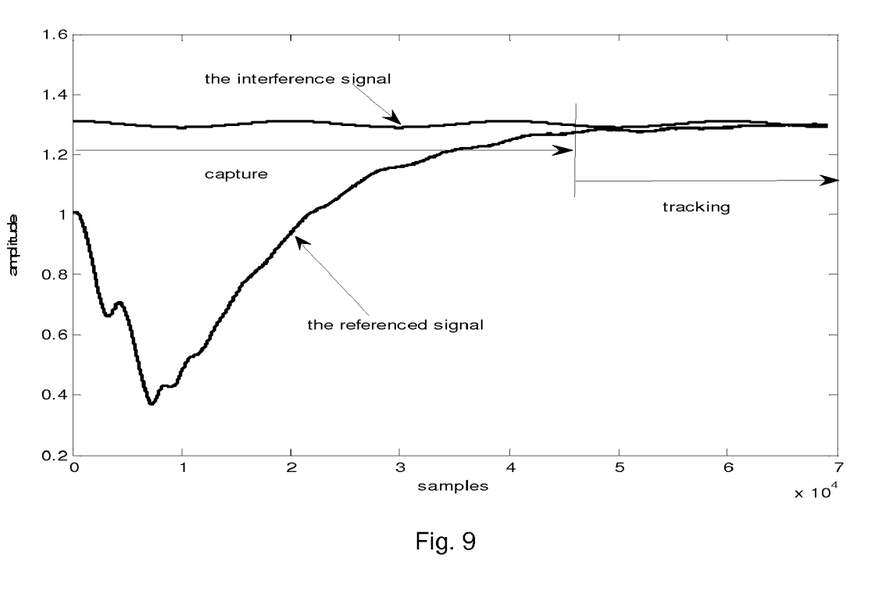
FIG. 9 illustrates a graph showing the change of the amplitude of the reference signal versus sampling times in example 1.

Referring to FIG. 9, a graph showing the change of the amplitude of the reference signal versus sampling times is illustrated. As can be seen in FIG. 9, the amplitude of the reference signal is very close to that of the interference signal during the tracking of the interference signal. In order to accelerate the capture of the interference signal and to suppress the dithering of the error signal, suitable adaptive structure and updating steps should be provided. In one embodiment, more than one set of updating steps can be applied, for example, a set of larger updating steps can be used first to accelerate the convergence, and then a set of smaller updating steps can be used to promote the precision of the tracking.

The methods and systems of the present application can be used in communication systems, digital TV receivers, radar systems, sonar systems, bio-tech applications etc. as long as the frequency spectrum of the useful signal is relatively smooth.

We claim:

1. A method for canceling an interference signal from a received signal, comprising:
    performing a time-frequency transform on the received signal;
    computing an estimated frequency of the interference signal using a result of the time-frequency transform;
    obtaining an estimated amplitude of the interference signal;
    generating a reference signal using the estimated frequency and the estimated amplitude of the interference signal;
    generating an error signal using the reference signal and the received signal based on minimum correlation criteria, wherein the error signal is defined as one of the following equations:

$\sigma(n)=(R(n)-I'(n))\text{conj}(I'(n))$ or $\sigma(n)=(R(n)-I'(n))\text{conj}(R(n))$, wherein, R(n) represents the received signal, I'(n) represents the reference signal, and n represents sampling times;
    updating the reference signal using the error signal based on an adaptive algorithm to minimize a difference between the reference signal and the interference signal;
    subtracting in time domain the reference signal from the received signal to produce a refined signal; and
    outputting the refined signal.

2. The method of claim 1, wherein the estimated amplitude is computed using the result of the time-frequency transform.

3. The method of claim 1, wherein the adaptive algorithm is selected from one of a LMS algorithm and a RLS algorithm.

4. The method of claim 3, wherein the reference signal is defined as the following equation:

$I'(n)=A'(n)\exp(j*2*\pi*f_0*n*T_s+j*\xi(n))$, wherein, A'(n) represents the amplitude part of the reference signal, $\exp(j*2*\pi*f_0*n*T_s+j*\xi(n))$ represents the phase part of the reference signal, $f_0$ represents the estimated frequency, $T_s$ represents sampling interval, $\xi(n)$ represents a dynamic component of the reference signal, and n represents sampling times.

5. The method of claim 4, wherein the amplitude part is updated first and the phase part is updated based on the updated amplitude part.

6. The method of claim 5, wherein when a LMS algorithm is used, the reference signal is updated according to the following equations:

$A'(n)=A'(n-1)+\lambda_1*\sigma(n-1)$, $\theta(n)=\text{mod}(\theta(n-1)+\lambda_2*\text{angle}(A'(n)),2*\pi)$, and $\xi(n)=\text{mod}(\theta(n)+\lambda_3*\text{angle}(A'(n)),2*\pi)$, wherein, $\lambda_1$, $\lambda_2$, and $\lambda_3$ are corresponding updating steps.

7. The method of claim 4, wherein the phase part is updated first and the amplitude part is updated based on the updated amplitude part.

8. The method of claim 1, wherein the refined signal is outputted into a storage medium.

9. A system for canceling an interference signal from a received signal:
    an interference frequency detecting device to conduct a time-frequency transform on the received signal, and to estimate a frequency of the interference signal using the results of the time-frequency transform to obtain an estimated frequency of the interference signal;
    an estimated amplitude generating device to obtain an estimated amplitude of the interference signal;
    a phase part calculating device to calculate a phase part of a reference signal using the estimated frequency of the interference signal and a dynamic component of the phase part of the reference signal from an updating device;
    a multiply operation device to multiply an amplitude part and the phase part of the reference signal to generate the reference signal;
    an error signal generating device to generate an error signal using the received signal and the reference signal based on a minimum correlation criteria, wherein the error signal is defined as one of the following equations:

$\sigma(n)=(R(n)-I'(n))\text{conj}(I'(n))$, or $\sigma(n)=(R(n)-I'(n))\text{conj}(R(n))$, wherein, R(n) represents the received signal, I'(n) represents the reference signal, and n represents sampling times;
    the updating device to update the amplitude part and the phase part of the reference signal using the error signal based on an adaptive algorithm to make the reference signal approach the interference signal; and
    an add operation device to subtract in time domain the reference signal from the received signal to cancel the interference signal.

10. The system of claim 9, wherein the estimated amplitude is calculated using the results of the time-frequency transform.

11. The system of claim 9, wherein the adaptive algorithm is one of all kinds of LMS algorithms and all kinds of RLS algorithms.

12. The system of claim 11, wherein the reference signal is defined as the following equation:

$I'(n)=A'(n)\exp(j*2*\pi*f_0*n*T_s+j*\xi(n))$, wherein, A'(n) represents the amplitude part of the reference signal, $\exp(j*2*\pi*f_0*n*T_s+j*\xi(n))$ represents the phase part of the reference signal, $f_0$ represents the estimated frequency, $T_s$ represents sampling interval, $\xi(n)$ represents a dynamic component of the reference signal, and n represents sampling times.

13. The system of claim 12, wherein the amplitude part is updated first, the phase part is updated based on the updated amplitude part.

14. The system of claim 13, wherein when the adaptive algorithm is a basic LMS algorithm, the reference signal is updated according to the following equations:

$A'(n)=A'(n-1)+\lambda_1*\sigma(n-1)$, $\theta(n)=\text{mod}(\theta(n-1)+\lambda_2*\text{angle}(A'(n)),2*\pi)$, and $\xi(n)=\text{mod}(\theta(n)+\lambda_3*\text{angle}(A'(n)),2*\pi)$, wherein, $\lambda_1$, $\lambda_2$, and $\lambda_3$ are corresponding updating steps.

15. The system of claim 12, wherein the phase part is updated first, the amplitude part is updated based on the updated amplitude part.

* * * * *